(12) United States Patent
Kawasaki

(10) Patent No.: US 11,159,143 B2
(45) Date of Patent: Oct. 26, 2021

(54) FILTER DEVICE AND METHOD FOR MANUFACTURING THE SAME

(71) Applicant: Murata Manufacturing Co., Ltd., Nagaokakyo (JP)

(72) Inventor: Koichiro Kawasaki, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 77 days.

(21) Appl. No.: 16/574,251

(22) Filed: Sep. 18, 2019

(65) Prior Publication Data

US 2020/0014369 A1 Jan. 9, 2020

Related U.S. Application Data

(63) Continuation of application No. PCT/JP2018/016242, filed on Apr. 20, 2018.

(30) Foreign Application Priority Data

Apr. 24, 2017 (JP) .............................. JP2017-085372

(51) Int. Cl.
| | | |
|---|---|---|
| *H03H 9/64* | (2006.01) | |
| *H03H 3/08* | (2006.01) | |
| *H03H 9/02* | (2006.01) | |
| *H03H 9/05* | (2006.01) | |
| *H03H 9/10* | (2006.01) | |
| *H03H 9/72* | (2006.01) | |

(52) U.S. Cl.
CPC ............ *H03H 9/6489* (2013.01); *H03H 3/08* (2013.01); *H03H 9/02834* (2013.01);
(Continued)

(58) Field of Classification Search
CPC .... H03H 9/6489; H03H 3/08; H03H 9/02834; H03H 9/059; H03H 9/1092; H03H 9/6483; H03H 9/725
(Continued)

(56) References Cited

U.S. PATENT DOCUMENTS

2009/0201102 A1   8/2009   Oda
2010/0043189 A1   2/2010   Fukano
(Continued)

FOREIGN PATENT DOCUMENTS

JP   2008-005241 A   1/2008
JP   2011-077938 A   4/2011
(Continued)

OTHER PUBLICATIONS

Chung et al. "Synthesis of Ladder-type Radio Frequency Surface Acoustic Wave Filter Based on Lumped Circuit Model by Using Neural Network" published in Sensors and Materials, vol. 31, No. 7 (2019) 2225-2236 2225, MYU Tokyo (Year: 2019).*
(Continued)

*Primary Examiner* — Hafizur Rahman
(74) *Attorney, Agent, or Firm* — Keating & Bennett, LLP

(57) ABSTRACT

A filter device includes a piezoelectric substrate, first and second functional elements provided on a surface of the piezoelectric substrate, a first conductive layer provided on the surface of the piezoelectric substrate, the first conductive layer connecting the first and second functional elements to each other, an insulating layer provided at least on the first conductive layer, a cover that faces the surface of the piezoelectric substrate, a support layer located between the surface of the piezoelectric substrate and the cover, the support layer defining hollow portions, in which the first and second functional elements are provided, between the piezoelectric substrate and the cover, and a first conductor that connects the insulating layer to the cover.

20 Claims, 18 Drawing Sheets

(52) U.S. Cl.
    CPC .......... *H03H 9/059* (2013.01); *H03H 9/1092* (2013.01); *H03H 9/6483* (2013.01); *H03H 9/725* (2013.01)

(58) Field of Classification Search
    USPC .......................................................... 333/133
    See application file for complete search history.

(56) References Cited

U.S. PATENT DOCUMENTS

| | | |
|---|---|---|
| 2015/0194948 A1 | 7/2015 | Inate |
| 2018/0159494 A1* | 6/2018 | Goto .................. H01L 41/1873 |

FOREIGN PATENT DOCUMENTS

| | | |
|---|---|---|
| JP | 2013-141330 A | 7/2013 |
| JP | 2015-156626 A | 8/2015 |
| WO | 2008059674 A1 | 5/2008 |
| WO | 2014/050307 A1 | 4/2014 |
| WO | 2015/190166 A1 | 12/2015 |

OTHER PUBLICATIONS

Wong et al, "RF transceiver reference design for third generation W-CDMA cellular handset", IEEE Transactions on Consumer Electronics • Jun. 2005, pp. 371-374 (Year: 2005).*
Official Communication issued in International Patent Application No. PCT/JP2018/016242, dated Jun. 5, 2018.

* cited by examiner

FILTER DEVICE AND METHOD FOR MANUFACTURING THE SAME

CROSS REFERENCE TO RELATED APPLICATIONS

This application claims the benefit of priority to Japanese Patent Application No. 2017-085372 filed on Apr. 24, 2017 and is a Continuation Application of PCT Application No. PCT/JP2018/016242 filed on Apr. 20, 2018. The entire contents of each application are hereby incorporated herein by reference.

BACKGROUND OF THE INVENTION

1. Field of the Invention

The present invention relates to filter devices and methods for manufacturing the filter devices, and more particularly to a wafer level chip size package filter device and a method for manufacturing the wafer level chip size package filter device.

2. Description of the Related Art

In recent years, wafer level chip size package (hereinafter abbreviated as WLCSP) filter devices having a package size reduced to an element size have been developed.

For example, Japanese Unexamined Patent Application Publication No. 2015-156626 discloses an example of a WLCSP filter device. More specifically, acoustic wave elements and wiring lines connected to the acoustic wave elements are formed on a wafer composed of a piezoelectric substrate. A cover member is placed on the piezoelectric substrate to define a vibration space for sealing the acoustic wave elements between the cover member and the piezoelectric substrate. The filter device forms a ladder filter in which the acoustic wave elements are alternately connected in series and parallel.

It is highly desirable for the above-described structure to efficiently dissipate heat from the acoustic wave elements and the wiring lines to the outside of the device to improve the electric power handling capability of the acoustic wave elements and the wiring lines. Japanese Unexamined Patent Application Publication No. 2015-156626 describes a configuration for efficiently transferring heat from a wiring line to a through conductor disposed in a cover member by arranging the wiring line in contact with the through conductor. According to Japanese Unexamined Patent Application Publication No. 2015-156626, the through conductor may be electrically connected to a reference potential or an input/output signal line.

A ladder filter is configured such that a current that flows through a wiring line connecting two series arm resonators (hereinafter referred to also as an "interterminal wiring line") is greater than a current that flows through a wiring line connected to a parallel arm resonator. Therefore, a relatively large amount of heat is generated in the interterminal wiring line. In particular, when a plurality of acoustic wave elements are densely arranged on a piezoelectric substrate to realize a small filter device, heat cannot be easily dissipated from the interterminal wiring line (heat accumulation easily occurs) and the temperature tends to increase.

However, when a through conductor connected to the interterminal wiring line is electrically connected to a reference potential or an input/output signal line as described in Japanese Unexamined Patent Application Publication No. 2015-156626, the potential of the interterminal wiring line changes to the potential of the reference potential or the input/output signal line. As a result, the filter characteristics of the filter device change, and there is a risk that the desired filter function cannot be provided. Thus, heat dissipation characteristics of the interterminal wiring line cannot be easily improved.

SUMMARY OF THE INVENTION

Preferred embodiments of the present invention provide filter devices each including an interterminal wiring line with heat dissipation characteristics that are able to be significantly improved without changing the filter characteristics and methods for manufacturing the filter devices.

A filter device according to a preferred embodiment of the present invention includes a piezoelectric substrate, first and second functional elements, a first conductive layer, an insulating layer, a cover, a support layer, and a first conductor. The first and second functional elements are provided on a surface of the piezoelectric substrate. The first conductive layer is provided on the surface of the piezoelectric substrate, and electrically connects the first and second functional elements to each other. The insulating layer is provided at least on the first conductive layer. The cover faces the surface of the piezoelectric substrate. The support layer is located between the surface of the piezoelectric substrate and the cover, and defines hollow portions, in which the first and second functional elements are provided, between the piezoelectric substrate and the cover. The first conductor that connects the insulating layer to the cover.

Preferably, the support layer is provided on the insulating layer, and the first conductor is a first via conductor that extends through the cover and the support layer and that is in contact with the insulating layer.

Preferably, the first via conductor overlaps the first conductive layer in plan view viewed in a thickness direction of the piezoelectric substrate.

Preferably, the support layer is provided on the insulating layer, and the first conductor includes a first via conductor that extends through the cover and the support layer and a wiring conductor located between the first via conductor and the insulating layer.

Preferably, the first via conductor and the wiring conductor overlap the first conductive layer in plan view viewed in a thickness direction of the piezoelectric substrate.

Preferably, the first conductor is a wiring conductor that extends from the insulating layer to the cover along an outer peripheral surface of the support layer.

Preferably, the filter device is flip-chip-mounted on a circuit board, and further includes a first external connection terminal that connects the first conductor to the circuit board.

Preferably, the filter device further includes a second conductive layer, a second conductor, and a second external connection terminal. The second conductive layer electrically connects the first functional element to the circuit board. The second conductor connects the second conductive layer to the cover. The second external connection terminal connects the second conductor to the circuit board.

Preferably, the second conductor is a second via conductor that extends through the cover and the support layer and that is in contact with the second conductive layer.

Preferably, the filter device is a ladder filter including series arm resonators and parallel arm resonators. Each of the first and second functional elements defines one of the series arm resonators.

Preferably, the insulating layer is provided on the surface of the piezoelectric substrate to cover the first and second functional elements and the first conductive layer.

Preferably, a thickness of the insulating layer is less than a thickness of the support layer.

A filter device according to a preferred embodiment of the present invention includes a piezoelectric substrate, first and second functional elements, a first conductive layer, a cover, a support layer, and a first conductor. The first and second functional elements are provided on a surface of the piezoelectric substrate. The first conductive layer is provided on the surface of the piezoelectric substrate and connects the first and second functional elements to each other. The cover faces the surface of the piezoelectric substrate. The support layer is located between the surface of the piezoelectric substrate and the cover, and defines hollow portions, in which the first and second functional elements are provided, between the piezoelectric substrate and the cover. The first conductor that connects the piezoelectric substrate to the cover.

A method for manufacturing a filter according to a preferred embodiment of the present invention includes (i) a step of preparing a piezoelectric substrate; (ii) a step of providing first and second functional elements, a first conductive layer that connects the first and second functional elements to each other, and a second conductive layer that connects the first functional element to an external connection terminal on a surface of the piezoelectric substrate; (iii) a step of forming an insulating layer at least on the first and second conductive layers; (iv) a step of removing a portion of the insulating layer that is provided on the second conductive layer; (v) a step of forming a support layer on the first and second conductive layers; (vi) a step of forming a first hole portion and a second hole portion in the support layer, the first hole portion extending through the support layer so that a surface of a portion of the insulating layer on the first conductive layer is exposed, the second hole portion extending through the support layer so that a surface of a portion of the second conductive layer is exposed; and (vii) a step of forming first and second conductors by filling the first and second hole portions with a conductor.

Preferably, the method for manufacturing the filter device further includes (viii) a step of connecting the external connection terminal to each of the first and second conductors.

Preferably, the method for manufacturing the filter device further includes (ix) a step of providing a cover layer on the support layer so that the cover layer faces the surface of the piezoelectric substrate, and the first and second hole portions are formed to extend through the cover layer and the support layer in (vi) the step of forming the first and second hole portions.

According to the preferred embodiments of the present invention, heat dissipation characteristics of an interterminal wiring line of a WLCSP filter device are able to be significantly improved without changing the filter characteristics.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
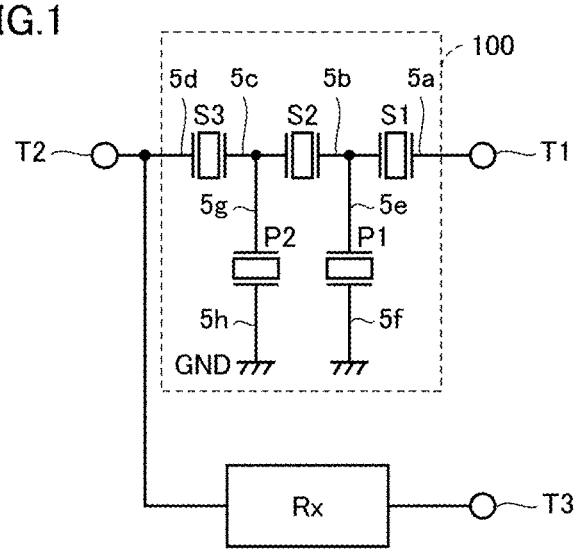
FIG. 1 is a schematic diagram illustrating the circuit structure of a filter device according to a first preferred embodiment of the present invention.

Preferred embodiments of the present invention will be described in detail with reference to the drawings. In the drawings, components that are the same as or correspond to one another are denoted by the same reference characters, and description thereof will not be repeated.

When the number, amount, etc., of elements are described in the following preferred embodiments, the scope of the present invention is not limited to the number, amount, etc. unless otherwise specified. In addition, each of the components described in the following preferred embodiments is not essential to the present invention unless otherwise specified.

A filter device 100 according to the embodiment preferred embodiment of the present invention is applied to, for example, a radio frequency (RF) circuit of a communication device, such as a cellular phone. The filter device 100 is a component that operates based on acoustic waves, and includes, for example, a surface acoustic wave (SAW) filter or a bulk acoustic wave (BAW) filter. In the preferred embodiments, a surface acoustic wave filter will be described as an example of the filter device 100.

FIG. 1 is a schematic diagram illustrating the circuit structure of the filter device 100 according to a first preferred embodiment of the present invention.

Referring to FIG. 1, the filter device 100 according to the first preferred embodiment may preferably be applied to, for example, a transmission filter of a duplexer. The filter device 100 is connected between an input terminal T1 and an antenna terminal T2. The filter device 100 filters a signal input to the input terminal T1 and outputs the filtered signal to the antenna terminal T2. A reception filter Rx is connected between the antenna terminal T2 and an output terminal T3. The reception filter Rx filters a signal input to the antenna terminal T2 and outputs the filtered signal to the output terminal T3. The reception filter Rx is, for example, a balanced longitudinally coupled resonator-type surface acoustic wave filter with a balanced-unbalanced transforming function.

A large electric power is able to be applied to a transmission filter of a duplexer that defines an RF circuit of a communication device, for example. Therefore, the filter device 100, which defines and functions as a transmission filter, is preferably able to handle high electric power.

The filter device 100 is preferably a ladder filter including a plurality of surface acoustic wave resonators connected in a ladder circuit topology. More specifically, the filter device 100 includes series arm resonators S1 to S3, parallel arm resonators P1 and P2, and wiring lines 5a to 5h.

The series arm resonators S1 to S3 are connected in series between the input terminal T1 and the antenna terminal T2. One terminal of the series arm resonator S1 is connected to the input terminal T1 by the wiring line 5a, and the other terminal of the series arm resonator S1 is connected to one terminal of the series arm resonator S2 by the wiring line 5b. The other terminal of the series arm resonator S2 is connected to one terminal of the series arm resonator S3 by the wiring line 5c. The other terminal of the series arm resonator S3 is connected to the antenna terminal T2 by the wiring line 5d.

One terminal of the parallel arm resonator P1 is connected to the connection node between the series arm resonators S1 and S2 by the wiring line 5e, and the other terminal of the parallel arm resonator P1 is connected to a ground wiring line GND by the wiring line 5f. One terminal of the parallel arm resonator P2 is connected to the connection node between the series arm resonators S2 and S3 by the wiring line 5g, and the other terminal of the parallel arm resonator P2 is connected to a ground wiring line GND by the wiring line 5h.

The series arm resonators S1 to S3 and the parallel arm resonators P1 and P2 are each preferably defined by a one-port surface acoustic wave resonator, for example. The surface acoustic wave resonator corresponds to an example of a "functional element".

A current that flows through the wiring lines 5a to 5d connecting the series arm resonators S1 to S3 of filter device 100 in series is greater than a current that flows through the wiring lines 5e to 5h connecting the parallel arm resonators P1 and P2 in parallel. Therefore, the amount of heat generated in the wiring lines 5a to 5d is greater than the amount of heat generated in the wiring lines 5e to 5h.

Among the wiring lines 5a to 5d, the wiring line 5b connecting the series arm resonators S1 and S2 and the wiring line 5c connecting the series arm resonators S2 and S3 define interterminal wiring lines. Each of the interterminal wiring lines receives heat from the series arm resonators at both ends thereof. Therefore, the amount of heat generated in the wiring lines 5b and 5c tends to be greater than the amount of heat generated in the wiring lines 5a and 5d. Accordingly, the wiring lines 5b and 5c are able to provide significantly improved heat dissipation characteristics.

Figure 2:
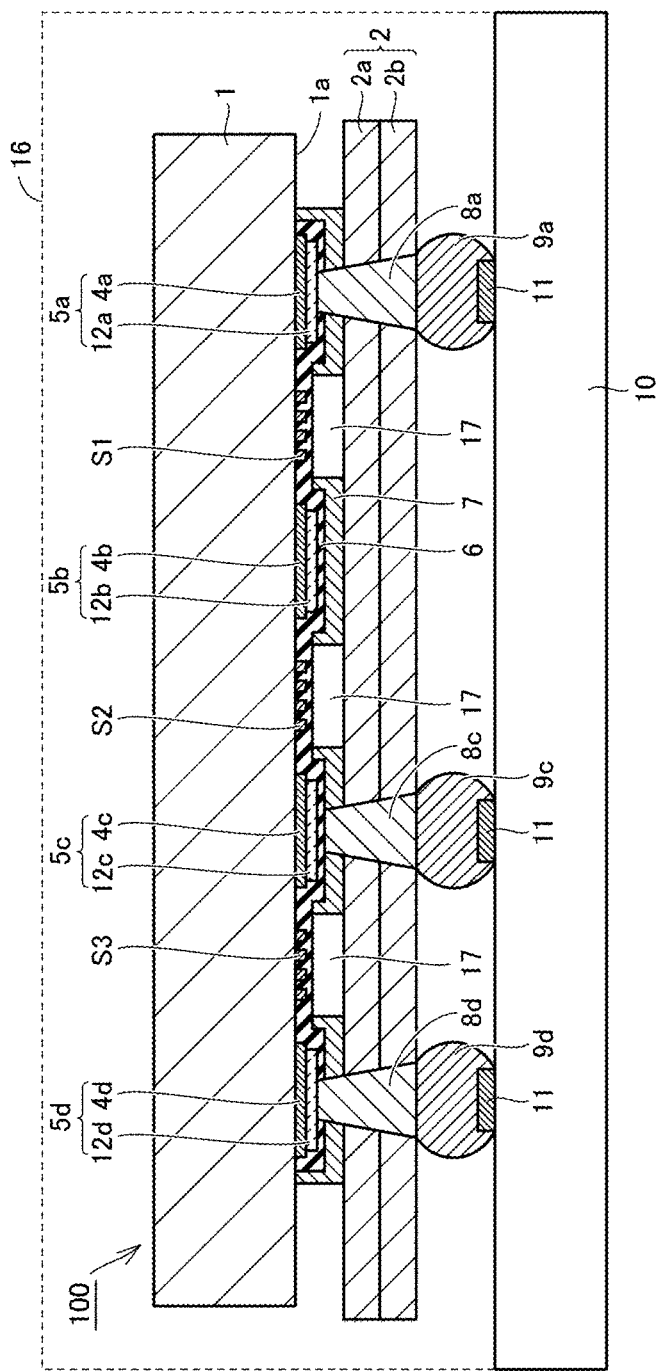
FIG. 2 is a schematic sectional view illustrating the structure of series arm resonators and wiring lines included in the filter device illustrated in FIG. 1.

FIG. 2 illustrates an example in which the filter device 100 illustrated in FIG. 1 is mounted on a circuit board 10. The filter device 100 is sealed by resin 16 while bumps 9a, 9c, and 9d are in contact with wiring lines 11 provided on the circuit board 10, and is thus mounted on the circuit board 10. In other words, the filter device 100 is flip-chip-mounted on the circuit board 10.

The circuit board 10 is a multilayer body including a plurality of dielectric layers and a plurality of electrode layers. The dielectric layers may each preferably be made of, for example, a resin or a ceramic such as alumina ($Al_2O_3$). In other words, the circuit board 10 may be a multilayer printed wiring board including a resin or a multilayer ceramic board.

FIG. 2 is a schematic sectional view illustrating the structure of the series arm resonators S1 to S3 and the wiring lines 5a to 5d included in the filter device 100 illustrated in FIG. 1.

Referring to FIG. 2, the filter device 100 includes a piezoelectric substrate 1, a cover layer 2, the series arm resonators S1 to S3, electrode layers 4a to 4d, wiring layers 12a to 12d, an insulating layer 6, a support layer 7, via conductors 8a, 8c, and 8d, and bumps 9a, 9c, and 9d.

In the following description, the series arm resonators S1 to S3 may be generically referred to simply as "series arm resonators S". The electrode layers 4a to 4d may be generically referred to simply as "electrode layers 4". The wiring layers 12a to 12d may be generically referred to simply as "wiring layers 12". The via conductors 8a, 8c, and 8d may be generically referred to simply as "via conductors 8". The bumps 9a, 9c, and 9d may be generically referred to simply as "bumps 9".

The piezoelectric substrate 1 is preferably a piezoelectric crystal substrate including, for example, lithium tantalate ($LiTaO_3$) or lithium niobate ($LiNbO_3$). The piezoelectric substrate 1 may be a substrate including a piezoelectric ceramic film or a piezoelectric thin film on a principal surface thereof. Alternatively, the piezoelectric substrate 1 may be a substrate including a silicon oxide ($SiO_2$) film on a surface thereof. The piezoelectric substrate 1 may be, for example, rectangular parallelepiped or substantially rectangular parallelepiped shaped, and has a rectangular or substantially rectangular shape in plan view viewed in the thickness direction of the piezoelectric substrate 1. The piezoelectric substrate 1 has a principal surface 1a. The principal surface 1a is one of the two principal surfaces of the piezoelectric substrate 1 that faces the circuit board 10.

The series arm resonators S1 to S3 are provided on the principal surface 1a of the piezoelectric substrate 1. Each of the series arm resonators S is preferably a conductor layer provided on the principal surface 1a and including aluminum (Al), copper (Cu), nickel (Ni), gold (Au), or platinum (Pt), for example, and includes a pair of comb-shaped electrodes (hereinafter referred to also as "inter digital transducer (IDT) electrodes"). Each of the series arm resonators S may additionally include two reflectors provided on both sides of the IDT electrodes in the direction in which surface acoustic waves propagate.

The size of each of the series arm resonators S1 to S3 is set to provide the ladder filter illustrated in FIG. 1 with predetermined transmission characteristics. The structure and principle of the series arm resonators S are the same or substantially the same as those of common surface acoustic wave resonators, and detailed description thereof is thus omitted.

The electrode layers 4a to 4d are provided on the principal surface 1a of the piezoelectric substrate 1. The electrode layers 4 include portions of the IDT electrodes of the series arm resonators S or wiring lines connected to the portions of the IDT electrodes. The electrode layers 4 are conductor layers preferably including Al, Cu, Ni, Au, or Pt, for example, provided on the principal surface 1a.

The electrode layer 4a is provided to electrically connect one comb-shaped electrode of the series arm resonator S1 to the input terminal T1 (FIG. 1). The electrode layer 4b is provided to electrically connect the other comb-shaped electrode of the series arm resonator S1 to one comb-shaped electrode of the series arm resonator S2. The electrode layer 4c is provided to electrically connect the other comb-shaped electrode of the series arm resonator S2 to one comb-shaped electrode of the series arm resonator S3. The electrode layer 4d is provided to electrically connect the other electrode of the series arm resonator S3 to the antenna terminal T2 (FIG. 1).

The wiring layers 12a to 12d are respectively provided on the electrode layers 4a to 4d. The wiring layers 12 are provided to increase adhesion to the via conductors 8 that are provided later. The wiring layers 12 may include a suitable metal depending on the metal that defines the via conductors 8. The wiring layers 12 are not essential.

In the first preferred embodiment, the electrode layers 4 and the wiring layers 12 correspond to examples of "conductive layers" connected to the series arm resonators S. The conductive layers define the wiring lines 5a to 5d of the filter device 100 illustrated in FIG. 1. More specifically, the electrode layer 4a and the wiring layer 12a define the wiring line 5a, and the electrode layer 4b and the wiring layer 12b define the wiring line 5b. Also, the electrode layer 4c and the wiring layer 12c define the wiring line 5c, and the electrode layer 4d and the wiring layer 12d define the wiring line 5d.

The cover layer 2 is provided on the principal surface 1a of the piezoelectric substrate 1 and faces the principal surface 1a. The cover layer 2 and the principal surface 1a preferably have the same or substantially the same rectangular shape in plan view. The cover layer 2 made of an insulating material which is preferably, for example, a resin, such as epoxy or polyimide, or an insulating ceramic, such as silicon oxide ($SiO_2$) or $Al_2O_3$.

In the example illustrated in FIG. 2, the cover layer 2 includes two cover layers 2a and 2b. The cover layer 2b significantly reduces or prevents moisture from entering the filter device 100, and includes a water-resistant insulating material (for example, polyimide). The cover layer 2b is provided after the support layer 7 is solidified. Therefore, when the cover layer 2b is placed directly on the support layer 7, there is a risk that the cover layer 2b is not able to be brought into close contact with the support layer 7. Accordingly, the cover layer 2a is provided between the support layer 7 and the cover layer 2b. In other words, the cover layer 2a bonds the support layer 7 and the cover layer 2b to each other. The cover layer 2a preferably includes, for example, epoxy.

The support layer 7 is located between the piezoelectric substrate 1 and the cover layer 2 so that hollow portions 17 that accommodate the series arm resonators S are provided between the piezoelectric substrate 1 and the cover layer 2. More specifically, the support layer 7 defines the hollow portions 17 by surrounding regions in which the series arm resonators S are provided on the principal surface 1a. The support layer 7 includes an insulating material, such as a resin or an insulating ceramic, for example. The support layer 7 is preferably made of a water-resistant insulating material (for example, polyimide) to prevent moisture from entering the filter device 100.

The insulating layer 6 is provided to cover the series arm resonators S, the electrode layers 4, and the wiring layers 12 on the principal surface 1a. The insulating layer 6 is preferably made of, for example, $SiO_2$, silicon nitride ($Si_3N_4$), or silicon (Si). The insulating layer 6 covers the series arm resonators S, the electrode layers 4, and the wiring layers 12 in the example illustrated in FIG. 2, but is not limited to this as long as the insulating layer 6 is provided at least on the wiring layer 12c.

As illustrated in FIG. 2, the via conductors 8a, 8c, and 8d extend through the cover layer 2 and the support layer 7 in the thickness direction. The via conductors 8a and 8d also extend through the insulating layer 6. In other words, one end portion of the via conductor 8a that is adjacent to the piezoelectric substrate 1 is connected to the wiring layer 12a, and one end portion of the via conductor 8d that is adjacent to the piezoelectric substrate 1 is connected to the wiring layer 12d. Unlike the via conductors 8a and 8d, the via conductor 8c does not extend through the insulating layer 6, and one end portion thereof that is adjacent to the piezoelectric substrate 1 is connected to the insulating layer 6.

The bumps 9a, 9c, and 9d are provided on the cover layer 2, and are connected to the end portions of the via conductors 8a, 8c, and 8d that are adjacent to the circuit board 10. The bumps each correspond to an example of an "external connection terminal". When the filter device 100 is mounted on the circuit board 10, the bumps 9 are connected to the wiring lines 11 provided on the circuit board 10.

The bumps 9 may preferably be made of, for example, solder such as Pb—Sn alloy solder, lead-free solder, Au—Sn alloy solder, or Au—Ge alloy solder. The external connection terminal is not limited to a bump, and may instead be, for example, a flat pad including a thin film including a conductive material.

As described above, the via conductors 8a and 8d extend through the cover layer 2, the support layer 7, and the insulating layer 6 and electrically connect the wiring layers 12a and 12d to the bumps 9a and 9d, respectively. In contrast, the via conductor 8c extends through the cover layer 2 and the support layer 7 but does not extend through the insulating layer 6, so that the wiring layer 12c and the bump 9c are electrically isolated from each other.

The via conductor 8c corresponds to an example of a "first via conductor", and defines a "first conductor". The "first conductor" is connected between the insulating layer 6 and the cover layer 2, and is therefore able to receive heat from a wiring line under the insulating layer 6 (first conductive layer) through the insulating layer 6 and dissipating the received heat to the outside of the cover layer 2 while being electrically isolated from the wiring line.

In contrast, the via conductors 8a and 8d each correspond to an example of a "second via conductor", and define a "second conductor". The "second conductor" is connected between a wiring line (second conductive layer) and the cover layer 2, and is therefore able to receive heat from the wiring line (conductive layer) and dissipating the received heat to the outside of the cover layer 2 while being electrically connected to the wiring line.

The structures of the first via conductor and the second via conductor will now be described in more detail.

Figure 3:
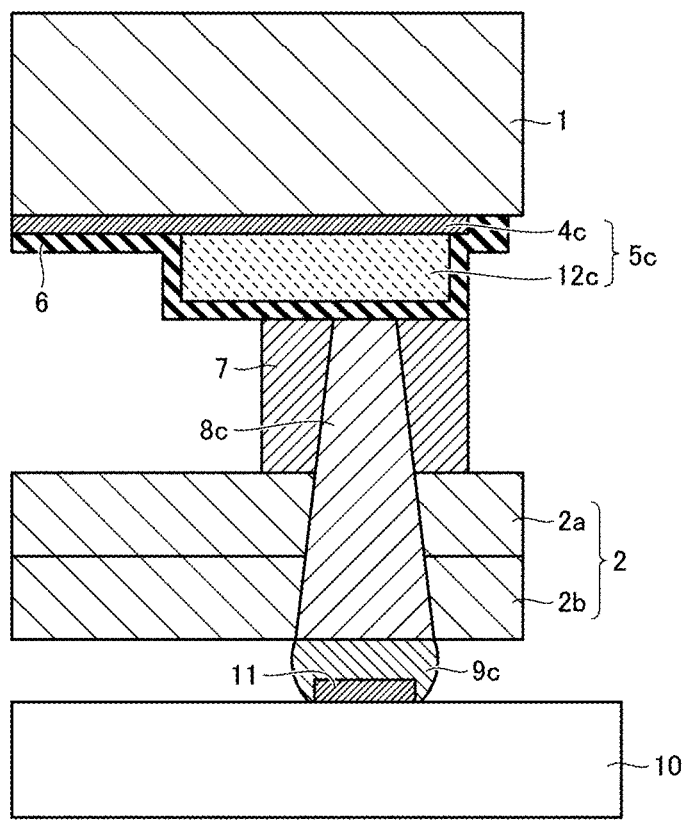
FIG. 3 is a partial sectional view illustrating the structure of a via conductor 8c (first via conductor) illustrated in FIG. 2.

FIG. 3 is a partial sectional view illustrating the structure of the via conductor 8c (first via conductor) illustrated in FIG. 2.

Referring to FIG. 3, the via conductor 8c is connected to the wiring layer 12c with the insulating layer 6 provided therebetween. The wiring layer 12c is connected to the electrode layer 4c. The electrode layer 4c and the wiring layer 12c define the wiring line 5c (interterminal wiring line) that connects the series arm resonator S2 and the series arm resonator S3 to each other. Heat generated by each of the series arm resonators S2 and S3 is transferred to the wiring line 5c. The wiring line 5c itself also generates Joule heat.

Unlike the wiring lines 5a and 5d, the wiring line 5c is not electrically connected to the bump 9. If the wiring line 5c is electrically connected to the bump 9, the wiring line 5c is electrically connected to the wiring line 11 on the circuit board 10 through the bump 9, and the potential of the wiring line 5c changes to the potential of the wiring line 11 (for example, the ground potential). When the potential of the wiring line 5c changes, the filter characteristics of the filter device 100 change. As a result, there is a risk that the filter function is not able to be provided.

Accordingly, the filter device according to the related art is configured such that an interterminal wiring line transfers heat generated by series arm resonators and by itself to an external connection wiring line through a piezoelectric substrate so that the heat is transferred from the external connection wiring line through a via conductor and dissipated from a bump. Thus, the heat dissipation path for the interterminal wiring line is longer and has a higher thermal resistance compared to the heat dissipation path for the external connection wiring line. As a result, heat dissipation characteristics of the interterminal wiring line and the series arm resonators connected thereto are degraded, and there is a risk that the filter characteristics of the filter device will change.

The material and thickness of the insulating layer 6 included in the filter device 100 according to the first preferred embodiment are such that the wiring layer 12c and the via conductor 8c are electrically isolated from each other and that the thermal resistance of the path along which heat is transferred from the wiring layer 12c to the via conductor 8c is able to be reduced. For example, the insulating layer 6 may be made of a highly thermally conductive resin such as $SiO_2$ or $Si_3N_4$. The thickness of the insulating layer 6 is sufficiently less than the thickness of the support layer 7, and may preferably be, for example, about 10 nm to about 10 μm. The insulating layer 6 may include a single layer structure or include a plurality of types of insulating layers.

In such a case, heat is able to be transferred from the wiring line 5c to the via conductor 8c through the insulating layer 6. In other words, the insulating layer 6 electrically isolates the wiring line 5c and the via conductor 8c from each other and thermally connects the wiring line 5c and the via conductor 8c to each other.

In addition, since the via conductor 8c is connected to the bump 9c, heat is able to be transferred from the via conductor 8c to the wiring line 11 on the circuit board 10 through the bump 9c. In other words, the insulating layer 6 and the via conductor 8c electrically isolate the wiring line 5c and the bump 9c from each other and thermally connect the wiring line 5c and the bump 9c to each other.

Thus, heat generated in the interterminal wiring line is able to be dissipated without transferring the heat through the piezoelectric substrate and the external connection wiring line as in the related art, and the length of the heat dissipation path for the interterminal wiring line is able to be reduced. As a result, the thermal resistance of the heat dissipation path is able to be reduced. In addition, the potential of the interterminal wiring line does not change. As a result, the heat dissipation characteristics of the interterminal wiring line are able to be significantly improved without changing the filter characteristics of the filter device 100.

Figure 4:
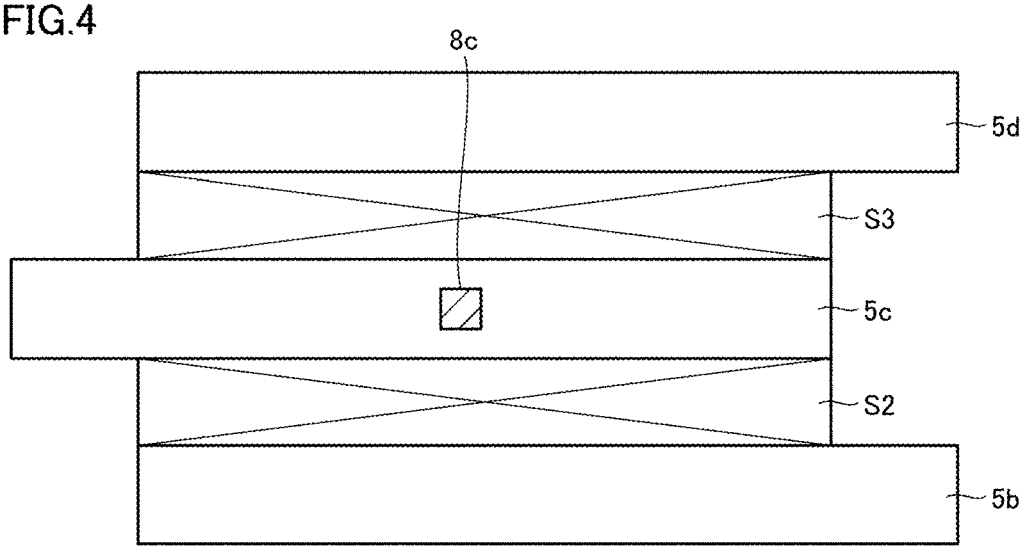
FIG. 4 is a plan view of the filter device illustrated in FIG. 2.

FIG. 4 is a plan view of the filter device 100 illustrated in FIG. 2, and shows partially enlarged views of the wiring lines 5b to 5d and the series arm resonators S2 and S3.

As illustrated in FIG. 4, the via conductor 8c overlaps the wiring line 5c connecting the series arm resonators S2 and S3 in plan view viewed in the thickness direction of the piezoelectric substrate 1. In the example illustrated in FIG. 4, one via conductor 8c, which has a rectangular or substantially rectangular shape in plan view, is provided in the central region of the wiring line 5c. The first via conductor may instead overlap the wiring line 5b connecting the series arm resonators S1 and S2 in plan view.

Figure 5:
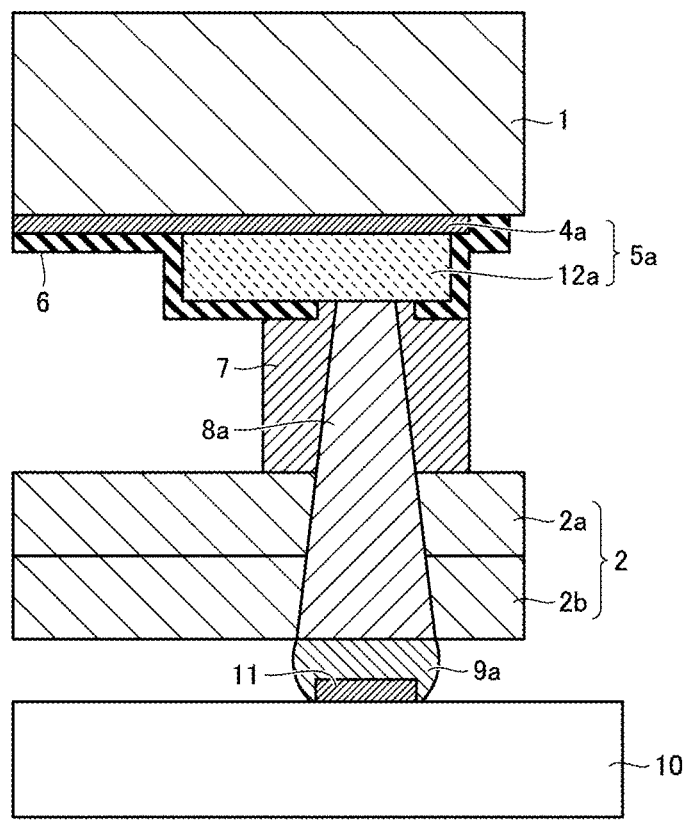
FIG. 5 is a partial sectional view illustrating the structure of a via conductor 8a (second via conductor) illustrated in FIG. 2.

FIG. 5 is a partial sectional view illustrating the structure of the via conductor 8a (second via conductor) illustrated in FIG. 2.

Referring to FIG. 5, the via conductor 8a extends through the insulating layer 6 and is connected to the wiring layer 12a. The wiring layer 12a is connected to the electrode layer 4a. The electrode layer 4a and the wiring layer 12a define the wiring line 5a (external connection wiring line) that connects the series arm resonator S1 to the input terminal T1. Heat generated by the series arm resonator S1 is transferred to the wiring line 5a. The wiring line 5a itself also generates Joule heat.

Heat is able to be transferred from the wiring line 5a to the bump 9a through the via conductor 8a, and is able to be transferred to the wiring line 11 on the circuit board 10 through the bump 9a. In other words, the via conductor 8a electrically connects the wiring line 5a and the bump 9a to each other and thermally connects the wiring line 5c and the bump 9c to each other.

As is clear from FIGS. 3 and 5, the structure of the via conductor 8c (first via conductor) is the same or substantially the same as that of the via conductor 8a (second via conductor), except that the via conductor 8c does not extend through the insulating layer 6. Therefore, the via conductor 8c and the via conductor 8a may be formed by the same step with the same or substantially the same material as described below.

The steps for manufacturing the via conductor 8c (first via conductor) and the via conductor 8a (second via conductor) will now be described with reference to FIGS. 6A to 6C, 6E to 6J, and 7A to 7J. It is to be noted that the via conductor 8c and the via conductor 8a may be formed simultaneously in the process of manufacturing the filter device 100.

Figure 6:
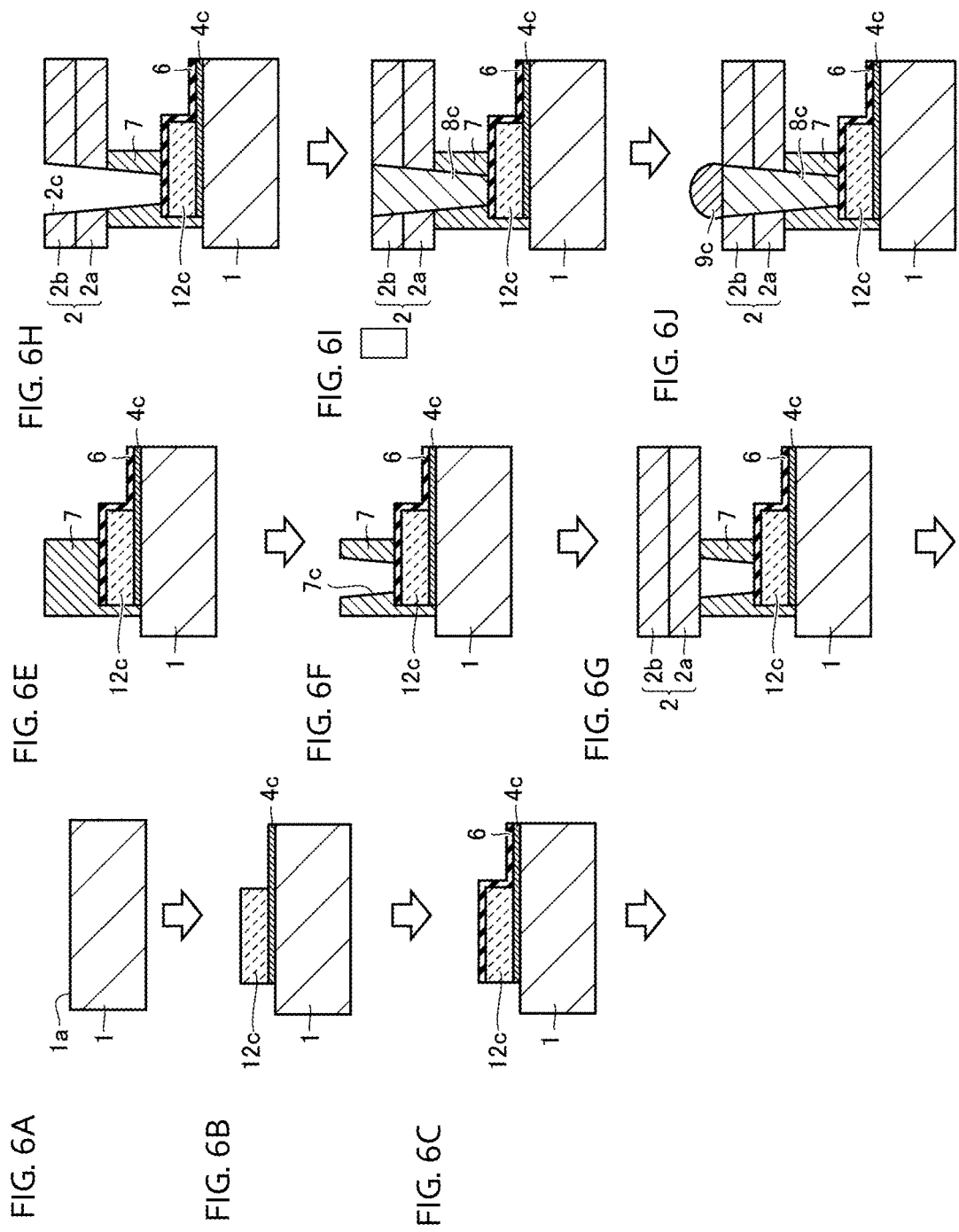
FIGS. 6A to 6C and 6E to 6J illustrate steps for manufacturing the first via conductor.

FIGS. 6A to 6C and 6E to 6J illustrate the steps for manufacturing the via conductor 8c. Referring to FIGS. 6A to 6C and 6E to 6J, first, as illustrated in FIG. 6A, the piezoelectric substrate 1 is prepared. The piezoelectric substrate 1 that is prepared includes, for example, a piezoelectric single-crystal material, such as $LiTaO_3$ or $LiNbO_3$.

Next, as illustrated in FIG. 6B, the electrode layers 4 and the wiring layers 12 are formed on the principal surface 1a of the piezoelectric substrate 1 together with a plurality of surface acoustic wave resonators (not shown). Each surface acoustic wave resonator includes IDT electrodes and reflectors provided on both sides of the IDT electrodes in the direction in which surface acoustic waves propagate. Each surface acoustic wave resonator defines a series arm resonator or a parallel arm resonator of a ladder filter.

The electrode layers 4 form portions of the IDT electrodes or wiring lines connected to the IDT electrodes. The surface acoustic wave resonators and the electrode layers 4 may be formed by a thin-film forming method, such as sputtering, vapor deposition, or chemical vapor deposition (CVD), for example. A pattern of a preferred shape is provided by, for example, photolithography by using a reduction projection exposure apparatus (stepper) and a reactive ion etching (RIE) apparatus. The surface acoustic wave resonators and the electrode layers 4 may be formed in the same step with the same or substantially the same material.

Next, the wiring layers 12 are formed on the electrode layers 4. The wiring layers 12 may also be formed by a thin-film forming method similar to the method that forms the surface acoustic wave elements and the electrode layers 4. The electrode layers 4 and the wiring layers 12 form conductive layers. The conductive layers define and function as wiring lines connected to the surface acoustic wave resonators.

Next, as illustrated in FIG. 6C, the insulating layer 6 is formed on the surface acoustic wave resonators, the electrode layers 4, and the wiring layers 12. The insulating layer 6 may be formed by a thin-film forming method such as sputtering, vapor deposition, or CVD, for example.

Next, as illustrated in FIG. 6E, the support layer 7 is formed on the insulating layer 6 by photolithography. More specifically, photosensitive polyimide is applied to a surface of the piezoelectric substrate 1 by spin coating. Next, the photosensitive polyimide is exposed to light and developed. Then, the photosensitive polyimide is heated and is thus solidified, and organic materials that have adhered to the insulating layer that covers the surface acoustic wave resonators are removed by oxygen plasma. Thus, the support layer 7 is formed.

Next, as illustrated in FIG. 6F, the support layer 7 is irradiated with a beam at a position where the via conductor 8c is to be formed. Thus, a via hole 7c is formed in the support layer 7. The method for forming the via hole 7c is not limited to the irradiation with a beam, and may instead be, for example, photolithography.

Next, as illustrated in FIG. 6G, the cover layers 2a and 2b are formed on the support layer 7. More specifically, a lamination film in which the cover layer 2a including an epoxy film and the cover layer 2b including a polyimide film are laminated together is prepared. Then, the lamination film is placed on and thermally pressure-bonded to the support layer 7.

Next, as illustrated in FIG. 6H, the cover layers 2a and 2b are irradiated with a beam at the position where the via conductor 8c is to be formed. Thus, a via hole 2c is formed in the cover layers 2a and 2b. The method for forming the via hole 2c is not limited to the irradiation with a beam, and may instead be, for example, photolithography. The via hole 2c and the via hole 7c communicate with each other.

Next, as illustrated in FIG. 6I, the via conductor 8c is formed by filling the via holes 2c and 7c with a conductor by electroplating, for example. Since the via conductor 8c is surrounded by the support layer 7, plating solution is prevented from entering the hollow portions 17.

Finally, as illustrated in FIG. 6J, the bump 9c is formed by applying solder paste to the via conductor 8c by printing.

Figure 7:
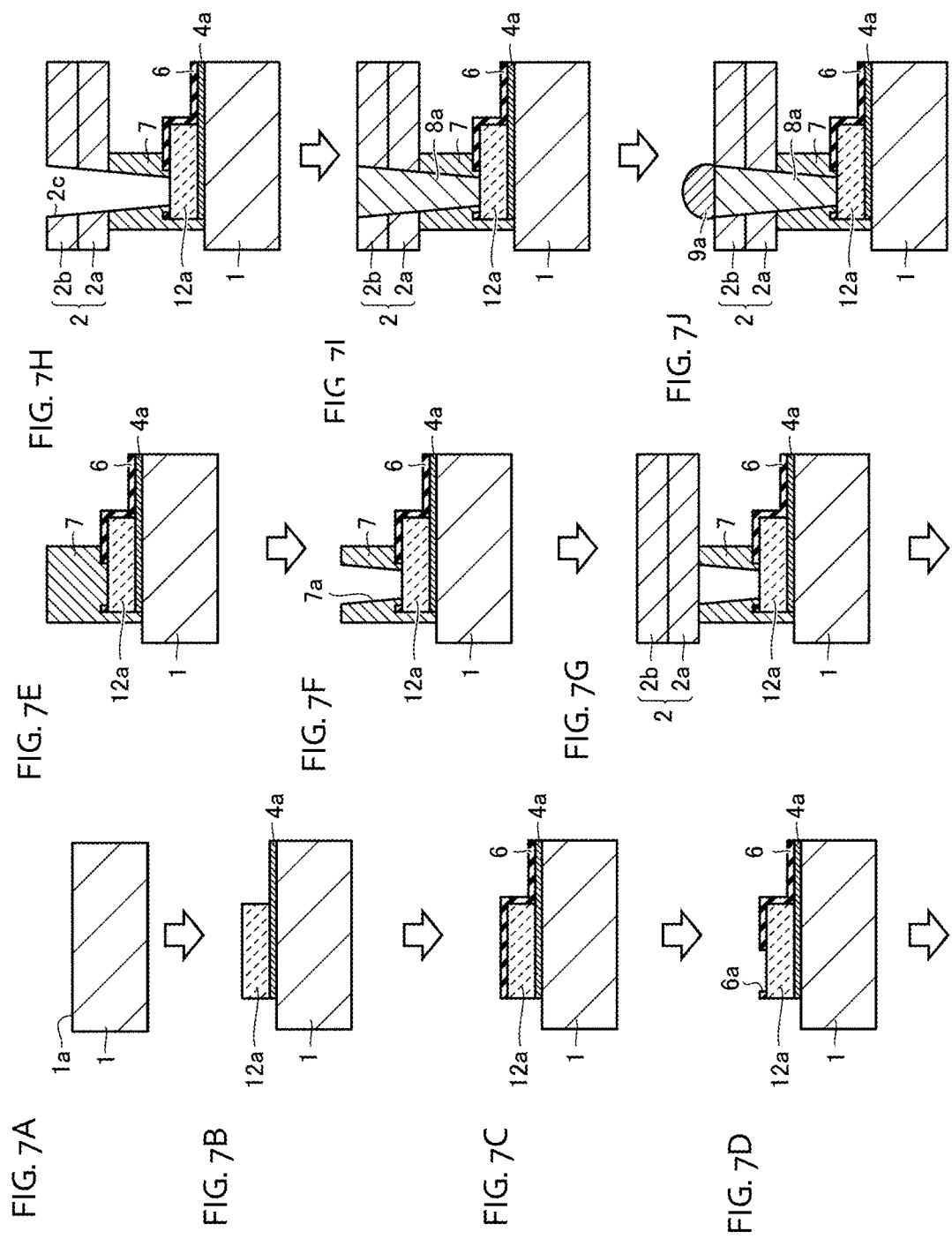
FIGS. 7A to 7J illustrate steps for manufacturing the second via conductor.

FIGS. 7A to 7J illustrate the steps for manufacturing the via conductor 8a. FIGS. 7A to 7J are to be compared with FIGS. 6A to 6C and 6E to 6J. The manufacturing steps illustrated in FIGS. 7A to 7J differ from the manufacturing steps illustrated in FIGS. 6A to 6C and 6E to 6J in that a step of removing a portion of the insulating layer 6 is additionally provided (see FIG. 7D). The steps illustrated in FIGS. 7A to 7C are similar to the steps illustrated in FIGS. 6A to 6C, and description thereof will not be repeated.

Referring to FIG. 7D, the insulating layer 6 is covered with a resist mask in the region surrounding the position where the via conductor 8a is to be formed, and is then etched so that a cavity 6a is formed in the insulating layer 6. Thus, a portion of a surface of the wiring layer 12a at the position where the via conductor 8a is to be formed is exposed at the cavity 6a.

The steps illustrated in FIGS. 7E to 7J are similar to the steps illustrated in FIGS. 6E to 6J, and description thereof will not be repeated. However, in FIG. 7D, the support layer 7 is formed on the wiring layer 12 in the region where the insulating layer 6 is removed (cavity 6a). Therefore, as illustrated in FIG. 7G, the cavity 6a defines and functions as a portion of the via hole 7a, and is finally filled with the via conductor 8a as illustrated in FIG. 7I.

As is clear from FIGS. 6A to 6C, 6E to 6J, and 7A to 7J, after the insulating layer 6 is formed, the support layer 7 is formed after or without removing the insulating layer 6 at the position where a via conductor is to be formed. Accordingly, the via conductor 8c (first via conductor) and the via conductor 8a (second via conductor) are able to be formed by the same or substantially the same steps after the step of forming the support layer 7. More specifically, the wiring layer 12c is covered with the insulating layer 6 at the position where the via conductor 8c is to be formed. Therefore, as illustrated in FIG. 6F, the via hole 7c that extends through the support layer 7 is able to be formed.

When the insulating layer 6 is not provided on the wiring layer 12c, the via hole 7c needs to be formed so that the via hole 7c does not extend through the support layer 7. In such a case, the beam needs to be stopped at an intermediate position of the support layer 7 although the management thereof in the height direction is difficult. Accordingly, a complex adjustment process is necessary.

According to the first preferred embodiment, the via hole 7c is able to be formed without performing a complex adjustment process, and the via hole 7a and the via hole 7c are able to be formed by the same or substantially the same steps. Therefore, the via conductor 8c is able to be easily formed. The above-described method for manufacturing the via conductors 8a and 8c and the filter device 100 are an example, and the manufacturing method is not limited to this.

As described above, according to the filter device 100 of the first preferred embodiment, the first via conductor is formed on an interterminal wiring line with a thin-film insulating layer provided therebetween, the interterminal wiring line connecting two series arm resonators to each other. Accordingly, heat generated by the series arm resonators and the interterminal wiring line is able to be transferred to the first via conductor along a heat dissipation path shorter than that according to the related art. Therefore, the heat dissipation characteristics of the interterminal wiring line are able to be significantly improved.

In addition, the first via conductor is connected to the circuit board by a bump, so that the interterminal wiring line and the circuit board are electrically isolated from each other but are thermally connected to each other. Accordingly, heat generated in the interterminal wiring line is able to be transferred to the circuit board through the insulating layer, the first via conductor, and the bump without changing the potential of the interterminal wiring line, so that the heat dissipation characteristics of the interterminal wiring line are able to be further significantly improved.

As a result, according to the filter device 100 of the first preferred embodiment, the heat dissipation characteristics of the interterminal wiring line are able to be significantly improved without changing the filter characteristics.

Modifications of the via conductor 8c, which defines and functions as the first via conductor, will be described with reference to FIGS. 8 to 16. In the following description, the structure and operational effects of a first via conductor according to each modification that differ from the structure and operational effects of the via conductor 8c illustrated in FIG. 3 will be mainly described, and description of aspects that are in common will not be repeated unless necessary.

Figure 8:
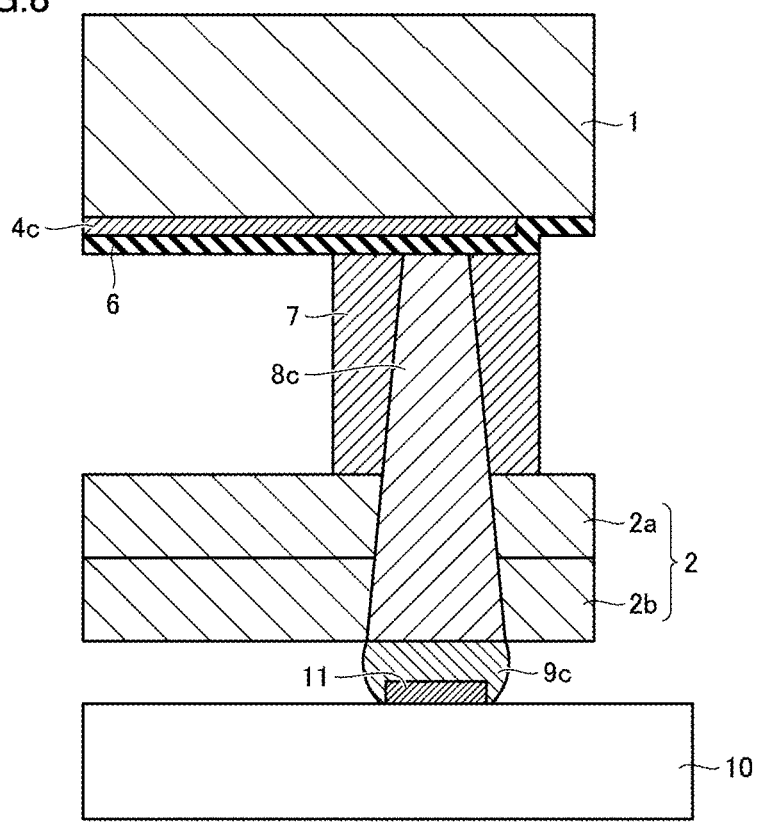
FIG. 8 is a partial sectional view illustrating the structure of a first via conductor according to a first modification of a preferred embodiment of the present invention.

FIG. 8 is a partial sectional view illustrating the structure of a via conductor 8c according to a first modification of a preferred embodiment of the present invention. FIG. 8 is to be compared with FIG. 3. In FIG. 3, the insulating layer 6 covers the electrode layer 4c and the wiring layer 12c. In contrast, in the first modification, no wiring layer 12c is provided on an electrode layer 4c, and an insulating layer 6 covers the electrode layer 4c. Also in the first modification, the electrode layer 4c and the via conductor 8c are electrically isolated from each other by the insulating layer 6, so that operational effects similar to those of the first preferred embodiment are able to be provided.

Figure 9:
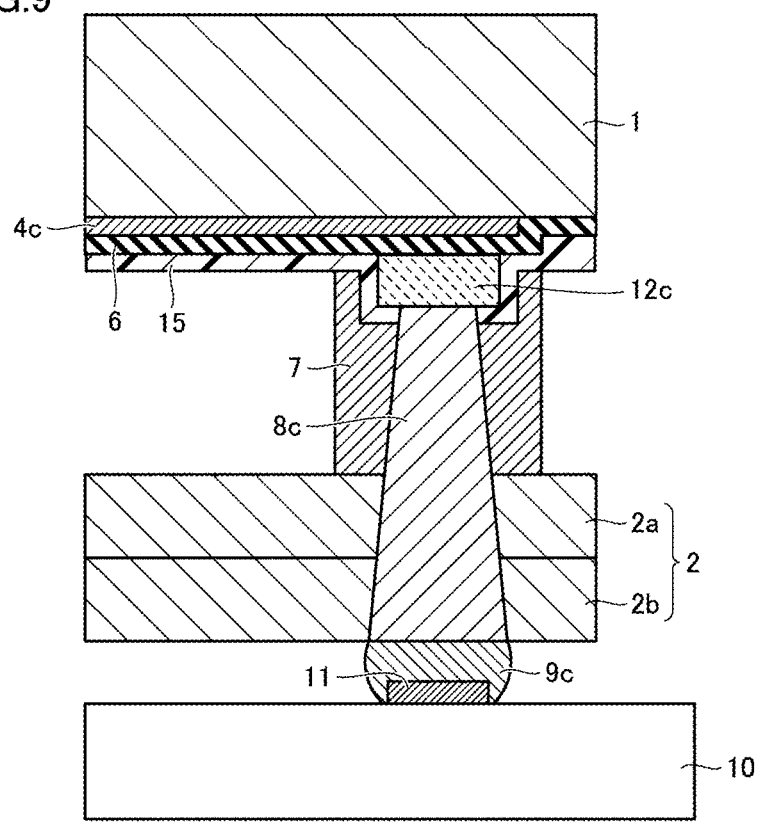
FIG. 9 is a partial sectional view illustrating the structure of a first via conductor according to a second modification of a preferred embodiment of the present invention.

FIG. 9 is a partial sectional view illustrating the structure of a via conductor 8c according to a second modification of a preferred embodiment of the present invention. FIG. 9 is to be compared with FIG. 3. In FIG. 3, the insulating layer 6 covers the electrode layer 4c and the wiring layer 12c. In contrast, in the second modification, no wiring layer 12c is provided on an electrode layer 4c, and an insulating layer 6 covers the electrode layer 4c. A wiring layer 12c is located between the via conductor 8c and the insulating layer 6. The insulating layer 6 and a portion of the wiring layer 12c that is not connected to the via conductor 8c are covered with, for example, a silicon nitride ($Si_3N_4$) layer 15.

According to the second modification, the wiring layer 12c corresponds to an example of a "wiring conductor". The wiring layer 12c and the via conductor 8c are electrically connected to each other and define the "first conductor". Also in the second modification, the electrode layer 4c and the first conductor (wiring layer 12c and via conductor 8c) are electrically isolated from each other by the insulating layer 6, so that operational effects similar to those of the first preferred embodiment are able to be provided.

Figure 10:
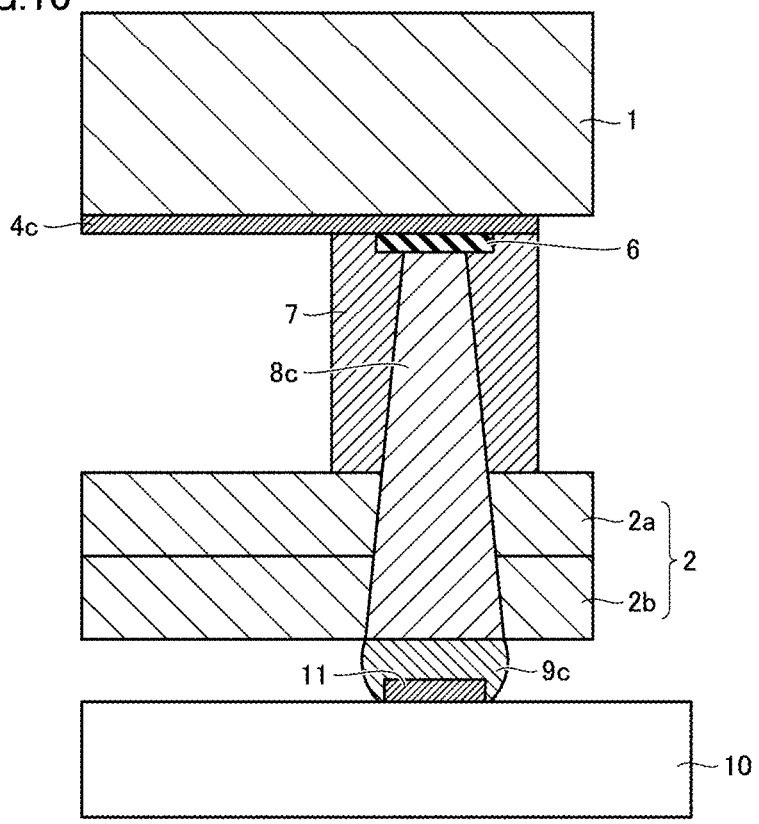
FIG. 10 is a partial sectional view illustrating the structure of a first via conductor according to a third modification of a preferred embodiment of the present invention.

FIG. 10 is a partial sectional view illustrating the structure of a via conductor 8c according to a third modification of a preferred embodiment of the present invention. FIG. 10 is to be compared with FIG. 3. In the third modification, unlike the structure illustrated in FIG. 3, an insulating layer 6 does not cover an electrode layer 4c over the entire area thereof, but covers the electrode layer 4c only in a region where the via conductor 8c is provided. Also in the third modification, the electrode layer 4c and the via conductor 8c are electrically isolated from each other by the insulating layer 6, so that operational effects similar to those of the first preferred embodiment are able to be provided.

Figure 11:
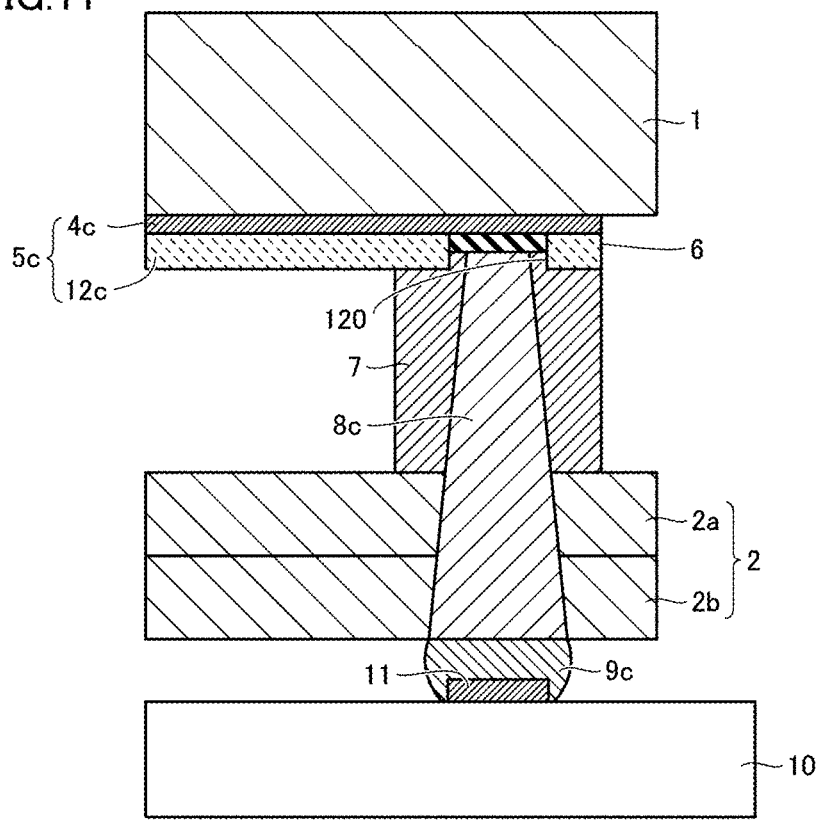
FIG. 11 is a partial sectional view illustrating the structure of a first via conductor according to a fourth modification of a preferred embodiment of the present invention.

FIG. 11 is a partial sectional view illustrating the structure of a via conductor 8c according to a fourth modification of a preferred embodiment of the present invention. FIG. 11 is to be compared with FIG. 3. In the fourth modification, a wiring layer 12c includes a cavity 120 provided in a region where the via conductor 8c is provided. An insulating layer 6 is provided in the cavity 120. Also in the fourth modification, the electrode layer 4c and the via conductor 8c are electrically isolated from each other by the insulating layer 6, so that operational effects similar to those of the first preferred embodiment are able to be provided.

Figure 12:
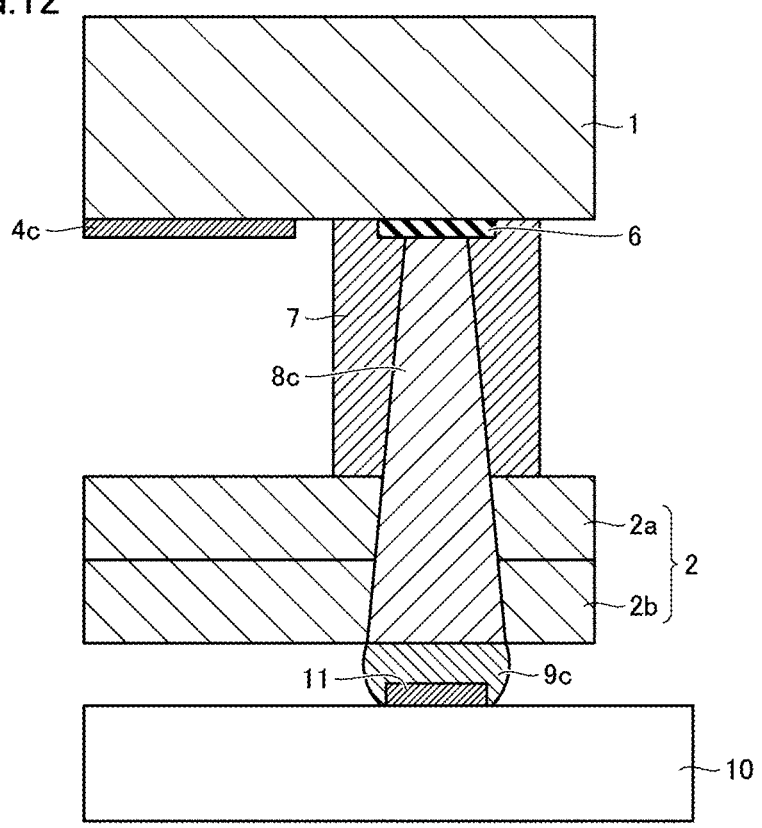
FIG. 12 is a partial sectional view illustrating the structure of a first via conductor according to a fifth modification of a preferred embodiment of the present invention.

FIG. 12 is a partial sectional view illustrating the structure of a via conductor 8c according to a fifth modification of a preferred embodiment of the present invention. FIG. 12 is to be compared with FIG. 3. In the fifth modification, a support layer 7 is not provided on an electrode layer 4 but is instead provided on a piezoelectric substrate 1. Accordingly, an insulating layer 6 is not provided on an electrode layer 4c but is instead provided on the piezoelectric substrate 1.

In the fifth modification, the electrode layer 4c and the via conductor 8c are electrically isolated from each other by the piezoelectric substrate 1 and the insulating layer 6. Therefore, heat generated by the electrode layer 4c is transferred to the via conductor 8c through the piezoelectric substrate 1 and the insulating layer 6. In the fifth modification, the heat dissipation path includes the piezoelectric substrate 1, and is therefore longer than that in FIG. 3. Accordingly, as illustrated in FIG. 12, the support layer 7 and the insulating layer 6 are located near the electrode layer 4c to reduce the amount of increase in the thermal resistance. Thus, the heat dissipation characteristics of the interterminal wiring line are able to be significantly improved.

Figure 13:
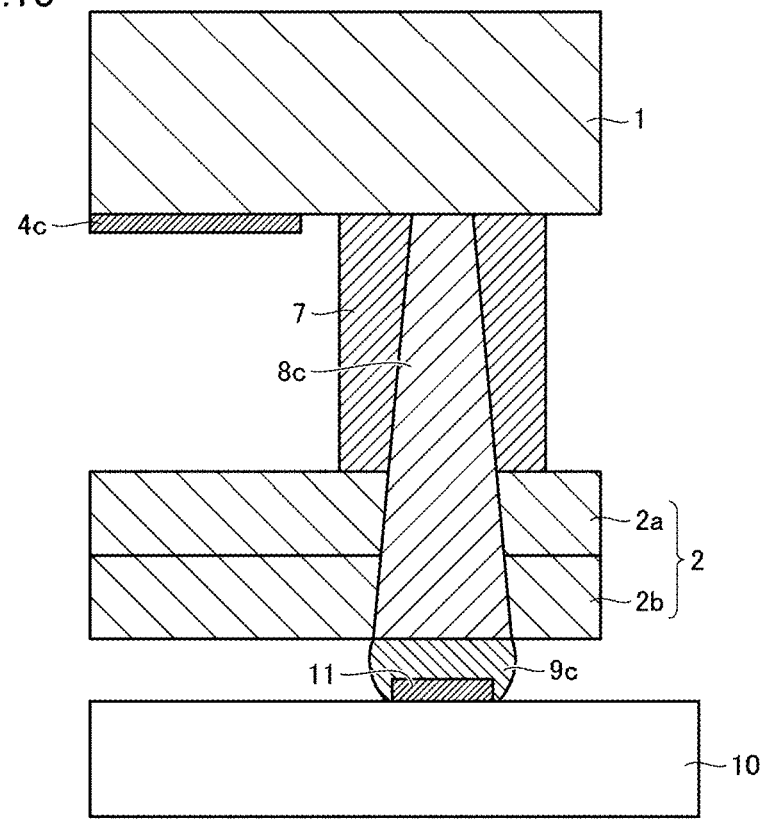
FIG. 13 is a partial sectional view illustrating the structure of a first via conductor according to a sixth modification of a preferred embodiment of the present invention.

FIG. 13 is a partial sectional view illustrating the structure of a via conductor 8c according to a sixth modification of a preferred embodiment of the present invention. FIG. 13 is to be compared with FIG. 3. In the sixth modification, the support layer 7 is not provided on an electrode layer 4 but is instead provided on a piezoelectric substrate 1. In addition, no insulating layer 6 is provided, and the via conductor 8c is directly connected to the piezoelectric substrate 1.

In the sixth modification, the electrode layer 4c and the via conductor 8c are electrically isolated from each other by the piezoelectric substrate 1. Therefore, heat generated by the electrode layer 4c is transferred to the via conductor 8c through the piezoelectric substrate 1. In the sixth modification, the heat dissipation path includes the piezoelectric substrate 1, and is therefore longer than that in FIG. 3. Accordingly, as illustrated in FIG. 13, the support layer 7 is located near the electrode layer 4c to reduce the amount of increase in the thermal resistance. Thus, the heat dissipation characteristics of the interterminal wiring line are able to be significantly improved.

Figure 14:
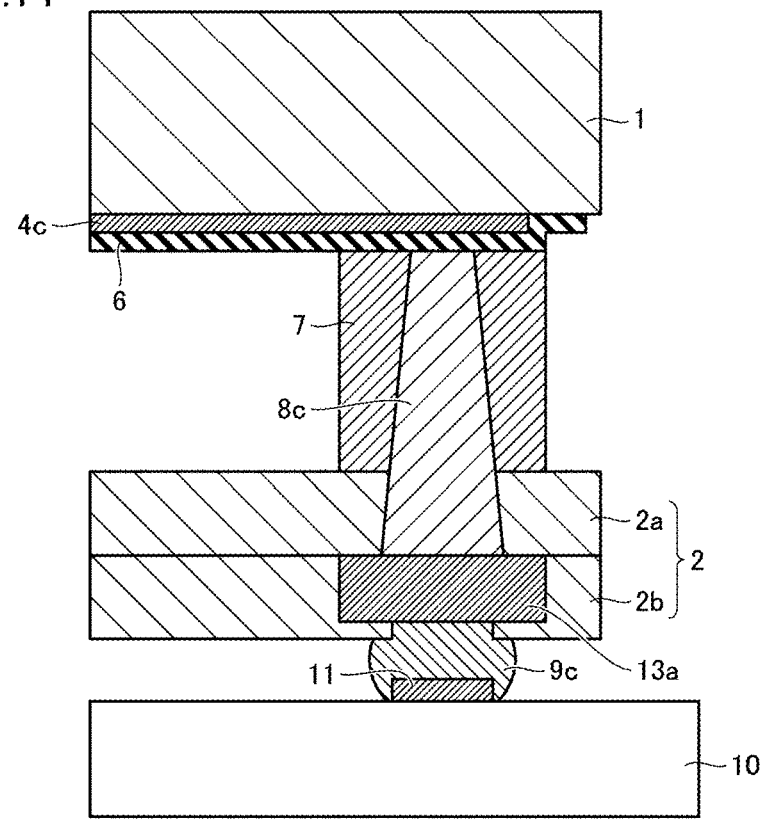
FIG. 14 is a partial sectional view illustrating the structure of a first via conductor according to a seventh modification of a preferred embodiment of the present invention.

FIG. 14 is a partial sectional view illustrating the structure of a via conductor 8c according to a seventh modification of a preferred embodiment of the present invention. FIG. 14 is to be compared with FIG. 3. In the seventh modification, a conductive member 13a is located between a cover layer 2a and a cover layer 2b of the cover layer 2. The conductive member 13a is positioned to overlap the via conductor 8c in plan view, and electrically connects the via conductor 8c and a bump 9c to each other. The conductive member 13a is, for example, a wiring line pattern.

According to the seventh modification, heat generated by the electrode layer 4c is transferred to a wiring line 11 on a circuit board 10 through an insulating layer 6, the via conductor 8c, the conductive member 13a, and the bump 9c. The via conductor 8c is connected to the conductive member 13a, so that the thermal capacity and surface area of the via conductor 8c are substantially greater than those in FIG. 3. Thus, heat is able to be more easily transferred. Accordingly, heat dissipation characteristics of the interterminal wiring lines are able to be further significantly improved.

Figure 15:
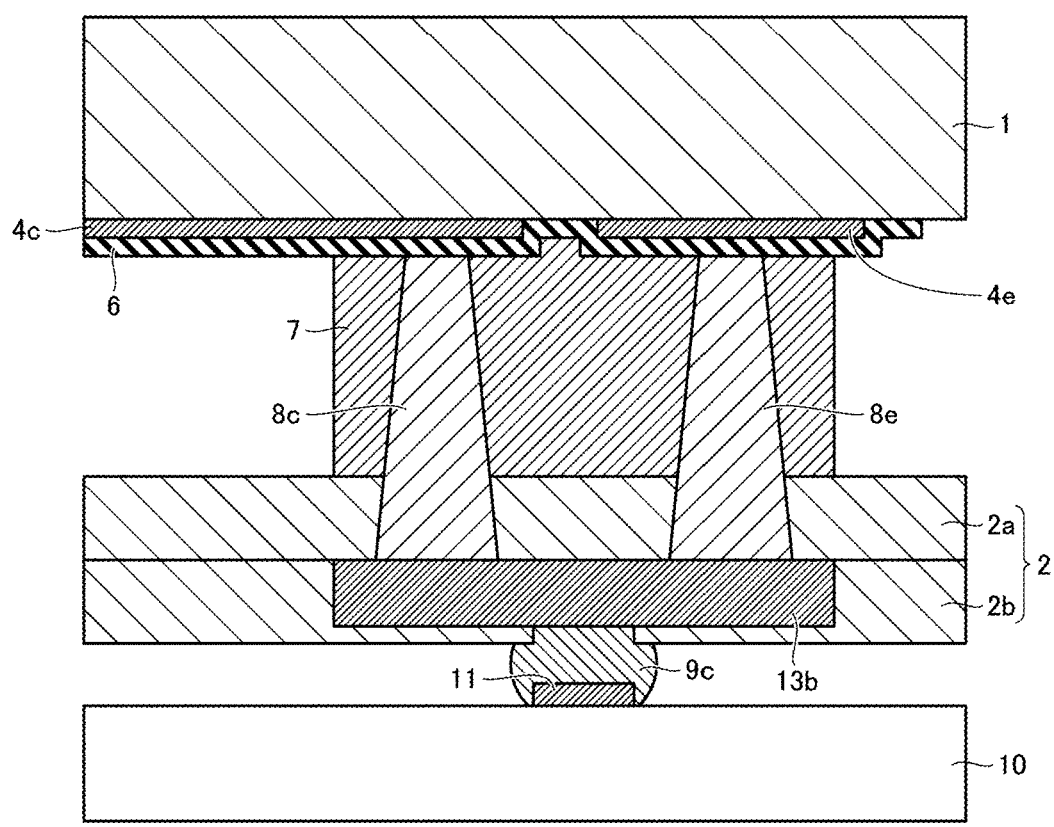
FIG. 15 is a partial sectional view illustrating the structure of a first via conductor according to an eighth modification of a preferred embodiment of the present invention.

FIG. 15 is a partial sectional view illustrating the structure of a via conductor 8c according to an eighth modification of a preferred embodiment of the present invention. FIG. 15 is to be compared with FIG. 3. In the eighth modification, an electrode layer 4e is provided on a piezoelectric substrate 1 at a position near an electrode layer 4c. The electrode layer 4e is electrically isolated from the electrode layer 4c, and is also electrically isolated from other electrode layers 4a, 4b, and 4d that are not illustrated. In other words, the electrode layer 4e is an isolated layer on the piezoelectric substrate 1. The electrode layer 4e and the electrode layer 4c are both covered with an insulating layer 6.

A support layer 7 is provided on the electrode layer 4c and the electrode layer 4e. A via conductor 8e extends through the cover layer 2 and the support layer 7. The via conductor 8e is positioned to overlap the electrode layer 4e in plan view.

A conductive member 13b is provided between a cover layer 2a and a cover layer 2b of the cover layer 2. The conductive member 13b overlaps the via conductors 8c and 8e in plan view, and electrically connects the via conductors 8c and 8e to the bump 9c. The conductive member 13b is preferably, for example, a wiring line pattern.

In the eighth modification, heat generated by the electrode layer 4c is transferred to a wiring line 11 on a circuit board 10 through the insulating layer 6, the via conductor 8c, the conductive member 13b, and the bump 9c. Part of the heat generated by the electrode layer 4c is transferred to the piezoelectric substrate 1. The heat that has been transferred to the piezoelectric substrate 1 is transferred to the conductive member 13b through the electrode layer 4e, the insulating layer 6, and the via conductor 8e, and then transferred from the conductive member 13b to the wiring line 11 on the circuit board 10 through the bump 9c.

According to the eighth modification, operational effects similar to those of the first preferred embodiment are able to be provided. The eighth modification includes a greater number of heat dissipation paths for the heat generated by the electrode layer 4c than in the preferred embodiment illustrated in FIG. 3. In addition, the via conductors 8c and 8e are connected to the conductive member 13b, so that the thermal capacity and surface area of each via conductor are able to be substantially increased. Thus, heat is able to be more easily transferred. As a result, the heat dissipation characteristics of the interterminal wiring line are able to be further significantly improved.

In the first preferred embodiment and the first to eighth modifications, a first via conductor (or a first via conductor and a wiring conductor) is described as an example of the "first conductor". However, the first conductor may instead be provided on an outer peripheral surface of the support layer 7 so that the first conductor does not extend through the support layer 7. Also in this case, operational effects similar to those of the first preferred embodiment are able to be provided.

Figure 16:
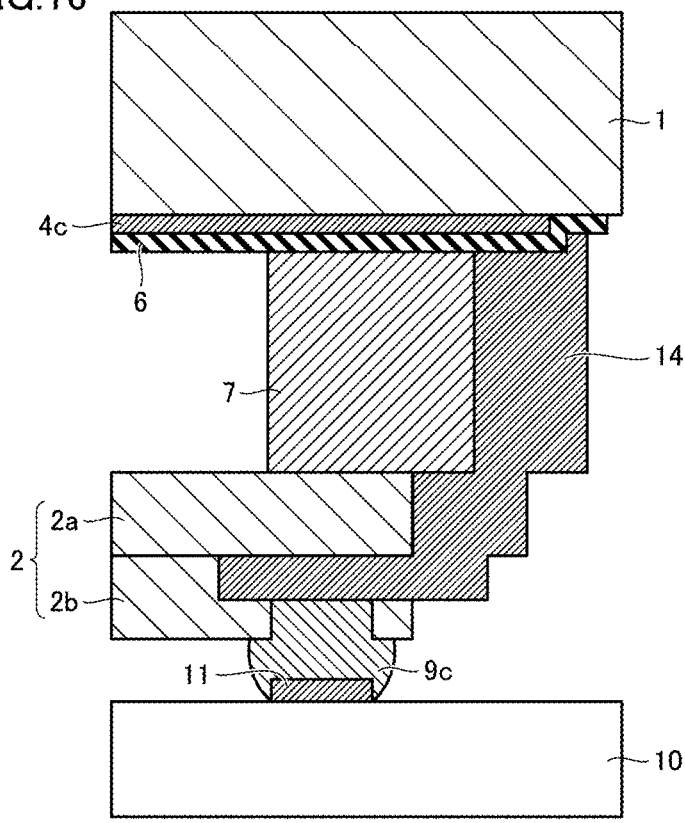
FIG. 16 is a partial sectional view illustrating the structure of a first via conductor according to a ninth modification of a preferred embodiment of the present invention.

FIG. 16 is a partial sectional view illustrating the structure of a wiring conductor 14 according to a ninth modification of a preferred embodiment of the present invention. FIG. 16 is to be compared with FIG. 3. In the ninth modification, the wiring conductor 14 extends from an insulating layer 6 to a cover layer 2 along an outer peripheral surface of a rod-shaped support layer 7. An end portion of the wiring conductor 14 that is adjacent to the circuit board 10 is connected to a portion between a cover layer 2a and a cover layer 2b. A bump 9c is connected to this end portion.

According to the ninth modification, heat generated by an electrode layer 4c is transferred to the wiring conductor 14 through the insulating layer 6. The heat that has been transferred to the wiring conductor 14 is transferred to a wiring line 11 on a circuit board 10 through the bump 9c. The surface of the wiring conductor 14 is not covered with a support layer 7 and is exposed. Therefore, the heat dissipation area is larger than that of the via conductor 8c, and the heat dissipating effect is able to be improved.

Arrangement examples of the first via conductor will now be described with reference to FIGS. 17 to 25.

FIGS. 17 to 25 are plan views of the filter device 100 illustrated in FIG. 2. FIGS. 17 to 25 are to be compared with FIG. 4. In the following description, differences between the arrangement example of the via conductor 8c illustrated in FIG. 4 and other arrangement examples of the first via conductor will be mainly described.

Figure 17:
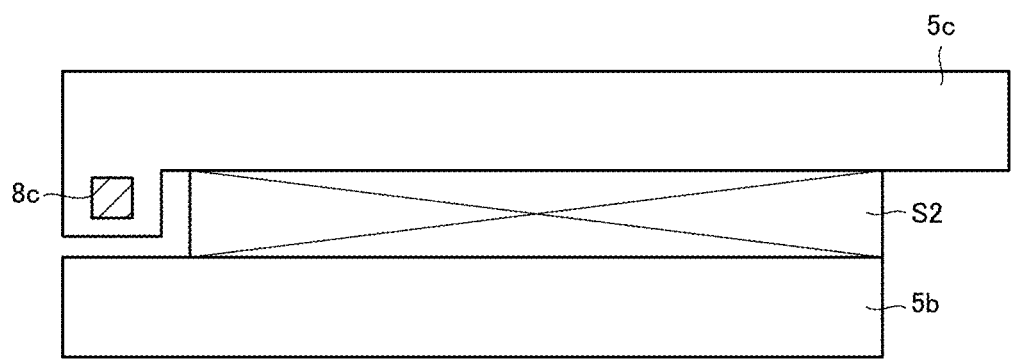
FIG. 17 is a plan view illustrating a first arrangement example of a first via conductor.

FIG. 17 illustrates a first arrangement example in which a via conductor 8c overlaps a wiring line 5c connecting series arm resonators S2 and S3 in plan view. In FIG. 17, one via conductor 8c, which preferably has a square or substantially square shape in plan view, is provided near one end portion of the series arm resonator S2 in the direction in which surface acoustic waves propagate.

Figure 18:
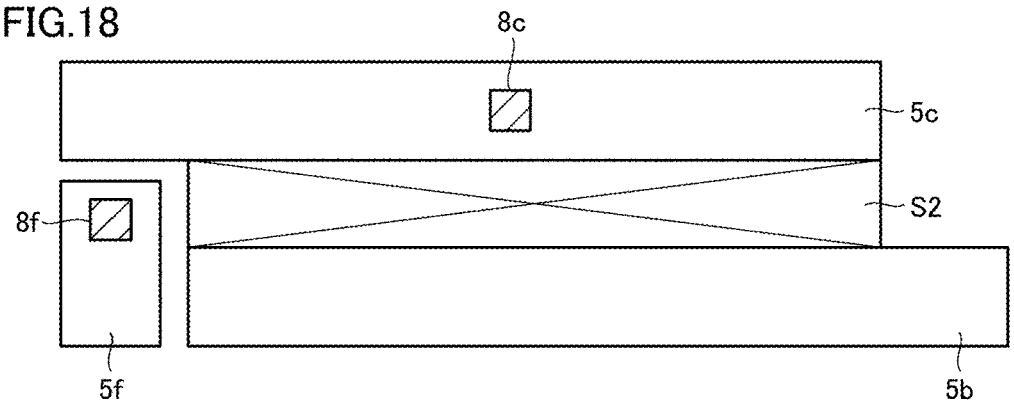
FIG. 18 is a plan view illustrating a second arrangement example of a first via conductor.

FIG. 18 illustrates a second arrangement example in which a wiring line 5f is provided next to wiring lines 5c and 5b on a principal surface of a piezoelectric substrate 1. A wiring layer 12f is electrically isolated from the wiring lines including the wiring lines 5c and 5b. Accordingly, the wiring line 5f is an isolated wiring line on the piezoelectric substrate 1.

A via conductor 8f is provided on the wiring line 5f. The structure of the via conductor 8f is the same or substantially the same as the structure of the via conductor 8c. Heat generated by the wiring line 5c is transferred to the via conductor 8c through an insulating layer 6 (not shown). A portion of the heat generated by the wiring line 5c is transferred to the piezoelectric substrate 1. The heat that has been transferred to the piezoelectric substrate 1 is transferred to the via conductor 8f through the wiring line 5f and the insulating layer 6. Since the via conductor 8f is provided in addition to the via conductor 8c, the number of heat dissipation paths for the wiring line 5c is able to be increased. As a result, the heat dissipation characteristics of the wiring line 5c are able to be further significantly improved.

Figure 19:
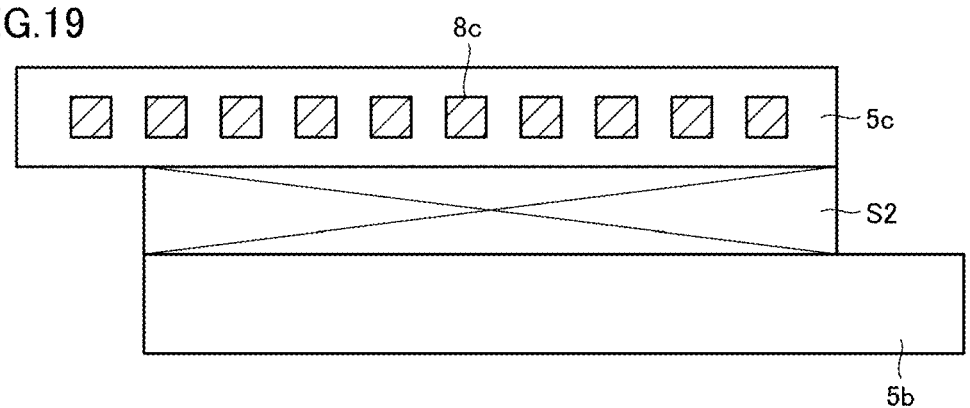
FIG. 19 is a plan view illustrating a third arrangement example of first via conductors.

FIG. 19 illustrates a third arrangement example in which a plurality of via conductors 8c overlap a wiring line 5c in plan view. According to the third arrangement example, heat generated by the wiring line 5c is able to be transferred to the plurality of via conductors 8c. Therefore, the heat dissipation characteristics of the wiring line 5c are able to be further significantly improved.

Figure 20:
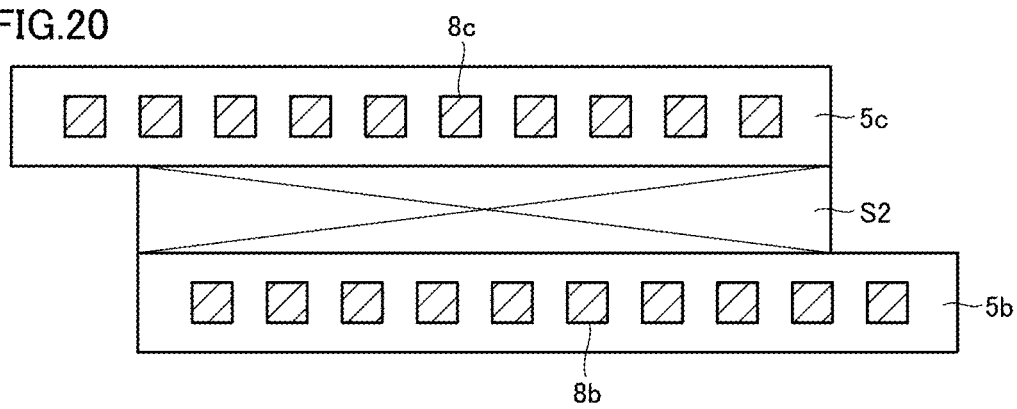
FIG. 20 is a plan view illustrating a fourth arrangement example of first via conductors.

FIG. 20 illustrates a fourth arrangement example in which a plurality of via conductors 8b are provided in addition to a plurality of via conductors 8c. The via conductors 8b overlap a wiring line 5b in plan view. The wiring line 5b connects the series arm resonators S1 and S2. Similar to a wiring line 5c, the wiring line 5b defines an interterminal wiring line. Since heat generated by the wiring line 5b is able to be transferred to the plurality of via conductors 8b, the heat dissipation characteristics of the wiring line 5b are able to be significantly improved. Similar to the via conductor 8c illustrated in FIG. 4, the number of via conductors 8b may instead be one.

Figure 21:
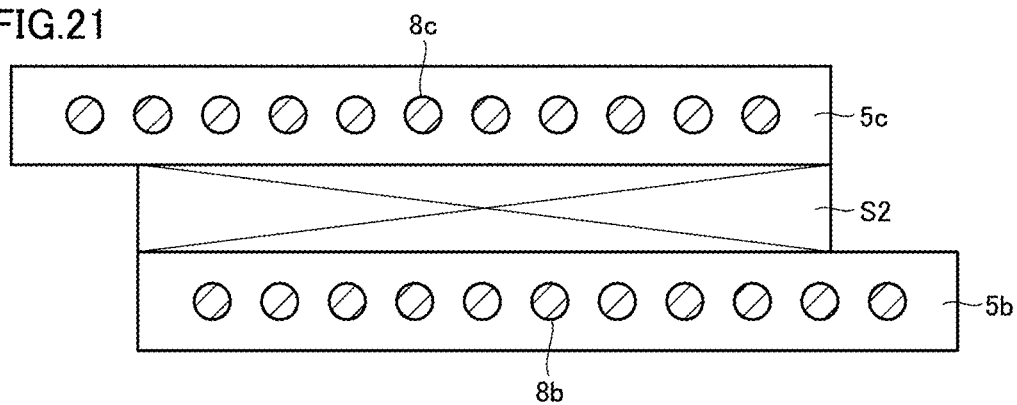
FIG. 21 is a plan view illustrating a fifth arrangement example of first via conductors.

FIG. 21 illustrates a fifth arrangement example in which via conductors 8c preferably have a circular or substantially circular shape in plan view. In the fifth arrangement example, similar to the example illustrated in FIG. 4, heat generated by the wiring line 5c is able to be dissipated to the via conductors 8c.

Figure 22:
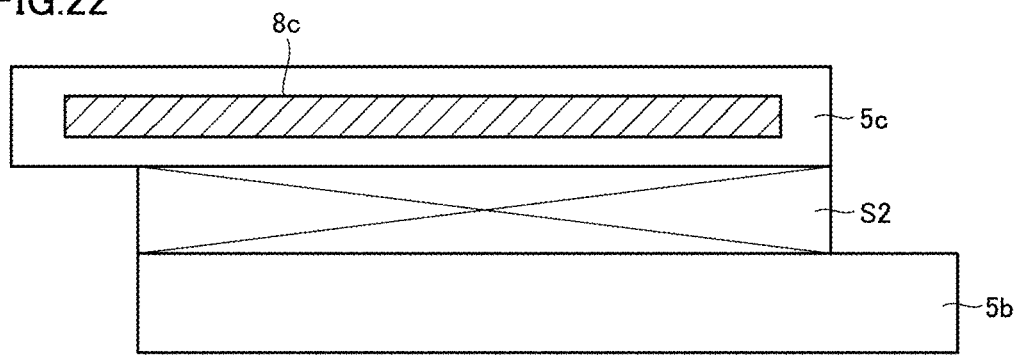
FIG. 22 is a plan view illustrating a sixth arrangement example of a first via conductor.

FIG. 22 illustrates a sixth arrangement example in which a via conductor 8c preferably has an elongated rectangular or substantially elongated rectangular shape with long sides extending in the direction in which surface acoustic waves propagate along a series arm resonator S2 in plan view. The via conductor 8c is provided by providing a through hole that extends through a support layer 7 provided on a wiring line 5c in the thickness direction of the support layer 7 and that is elongated in the direction in which surface acoustic waves propagate and filling the through hole with a conductor. According to the sixth arrangement example, heat generated by the wiring line 5c is able to be efficiently transferred to the via conductor 8c. Therefore, the heat dissipation characteristics of the wiring line 5c are able to be further significantly improved.

Figure 23:
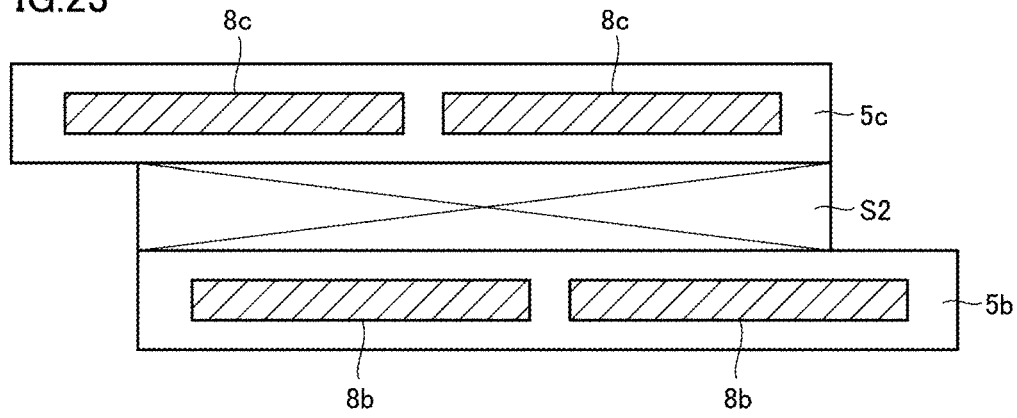
FIG. 23 is a plan view illustrating a seventh arrangement example of first via conductors.

FIG. 23 illustrates a seventh arrangement example in which two via conductors 8c are provided on a wiring line 5c, and two via conductors 8b are provided on a wiring line 5b. The two via conductors 8 on each wiring line 5 preferably have an elongated rectangular or substantially elongated rectangular shape with long sides extending in the direction in which surface acoustic waves propagate along a series arm resonator S2 in plan view. According to the seventh arrangement example, the heat dissipation characteristics of the wiring lines 5c and 5b are able to be significantly improved. The number of via conductors 8 provided on each wiring line 5 may instead be three or more.

Figure 24:
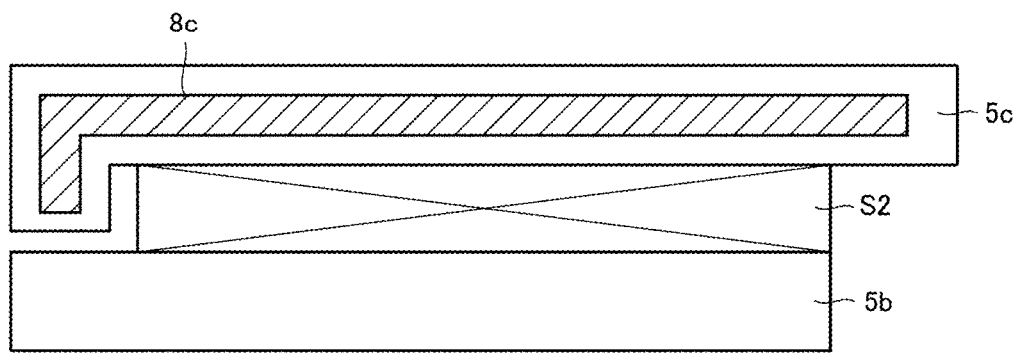
FIG. 24 is a plan view illustrating an eighth arrangement example of a first via conductor.

FIG. 24 illustrates an eighth arrangement example in which a wiring line 5c is preferably substantially L-shaped in plan view. Accordingly, a via conductor 8c is also substantially L-shaped in plan view. When the shape of the via conductor 8c in plan view matches the shape of the wiring line 5c in plan view, heat generated by the wiring line 5c is able to be efficiently transferred to the via conductor 8c irrespective of the shape of the wiring line 5c.

Figure 25:
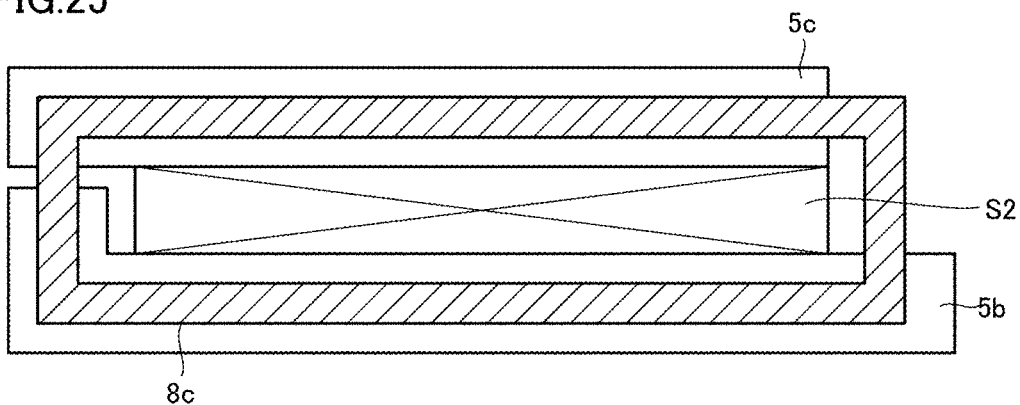
FIG. 25 is a plan view illustrating a ninth arrangement example of a first via conductor.

FIG. 25 illustrates a ninth arrangement example in which a via conductor 8c surrounds a series arm resonator S2 in plan view. The via conductor 8c is preferably hollow square shaped in plan view, and is positioned to overlap wiring lines 5c and 5b. According to the ninth arrangement example, heat generated by the wiring lines 5c and 5b is able to be transferred to the via conductor 8c. Accordingly, the heat dissipation characteristics of the wiring lines 5c and 5b are able to be significantly improved.

Portions or entireties of the above-described examples and modifications may be employed in any technically possible combinations.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter device comprising:
a piezoelectric substrate;
first and second functional elements provided on a surface of the piezoelectric substrate;
a first conductive layer provided on the surface of the piezoelectric substrate, the first conductive layer electrically connecting the first and second functional elements to each other;
an insulating layer provided at least on the first conductive layer;
a cover that faces the surface of the piezoelectric substrate;
a support layer located between the surface of the piezoelectric substrate and the cover, the support layer defining hollow portions, in which the first and second functional elements are provided, between the piezoelectric substrate and the cover; and
a first conductor that connects the insulating layer to the cover.

2. The filter device according to claim 1, wherein
the support layer is provided on the insulating layer; and
the first conductor is a first via conductor that extends through the cover and the support layer and that is in contact with the insulating layer.

3. The filter device according to claim 2, wherein the first via conductor overlaps the first conductive layer in plan view viewed in a thickness direction of the piezoelectric substrate.

4. The filter device according to claim 1, wherein
the support layer is provided on the insulating layer; and
the first conductor includes a first via conductor that extends through the cover and the support layer and a wiring conductor located between the first via conductor and the insulating layer.

5. The filter device according to claim 4, wherein the first via conductor and the wiring conductor overlap the first conductive layer in plan view viewed in a thickness direction of the piezoelectric substrate.

6. The filter device according to claim 1, wherein the first conductor is a wiring conductor that extends from the insulating layer to the cover along an outer peripheral surface of the support layer.

7. The filter device according to claim 1, wherein
the filter device is flip-chip-mounted on a circuit board; and
the filter device further comprises a first external connection terminal that connects the first conductor to the circuit board.

8. The filter device according to claim 7, further comprising:
a second conductive layer that electrically connects the first functional element to the circuit board;
a second conductor that connects the second conductive layer to the cover; and
a second external connection terminal that connects the second conductor to the circuit board.

9. The filter device according to claim 8, wherein the second conductor is a second via conductor that extends through the cover and the support layer and that is in contact with the second conductive layer.

10. The filter device according to claim 1, wherein
the filter device is a ladder filter including a plurality of series arm resonators and a plurality of parallel arm resonators; and
each of the first and second functional elements defines one of the plurality of series arm resonators.

11. The filter device according to claim 1, wherein the insulating layer is provided on the surface of the piezoelectric substrate to cover the first and second functional elements and the first conductive layer.

12. The filter device according to claim 1, wherein a thickness of the insulating layer is less than a thickness of the support layer.

13. A filter device comprising:
a piezoelectric substrate;
first and second functional elements provided on a surface of the piezoelectric substrate;
a first conductive layer provided on the surface of the piezoelectric substrate, the first conductive layer connecting the first and second functional elements to each other;
a cover that faces the surface of the piezoelectric substrate;
a support layer located between the surface of the piezoelectric substrate and the cover, the support layer defining hollow portions, in which the first and second functional elements are provided, between the piezoelectric substrate and the cover; and
a via conductor that connects the piezoelectric substrate to the cover;
wherein
the via conductor is directly connected to the piezoelectric substrate.

14. A method for manufacturing a filter device comprising:
a step of preparing a piezoelectric substrate;
a step of providing first and second functional elements, a first conductive layer that connects the first and second functional elements to each other, and a second conductive layer that connects the first functional element to an external connection terminal on a surface of the piezoelectric substrate;
a step of forming an insulating layer at least on the first and second conductive layers;
a step of removing a portion of the insulating layer that is provided on the second conductive layer;
a step of forming a support layer on the first and second conductive layers;
a step of forming a first hole portion and a second hole portion in the support layer, the first hole portion extending through the support layer so that a surface of a portion of the insulating layer on the first conductive layer is exposed, the second hole portion extending through the support layer so that a surface of a portion of the second conductive layer is exposed; and
a step of forming first and second conductors by filling the first and second hole portions with a conductor.

15. The method for manufacturing the filter device according to claim 14, further comprising a step of connecting the external connection terminal to each of the first and second conductors.

16. The method for manufacturing the filter device according to claim 14, further comprising:
a step of providing a cover layer on the support layer; wherein
the cover layer faces the surface of the piezoelectric substrate; and
the first and second hole portions are formed to extend through the cover layer and the support layer in the step of forming the first and second hole portions.

17. A duplexer, comprising:
an input terminal;
an antenna terminal; and
the filter device according to claim 1, wherein
the filter device filters a signal input to the input terminal and outputs a filtered signal to the antenna terminal.

18. The filter device according to claim 10, wherein
the plurality of series arm resonators are connected in series between an input of the filter device and an output of the filter device; and
at least one of the plurality of parallel arm resonators is connected between a ground and a connection node between at least two of the plurality of series arm resonators.

19. The filter device according to claim 9, wherein the second via conductor thermally connects the second conductive layer to a bump provided on the cover.

20. The filter device according to claim 4, wherein the insulating layer electrically isolates the first conductive layer and the first via conductor from each other and thermally connects the first conductive layer and the first via conductor to each other.

* * * * *